(12) United States Patent
Kim et al.

(10) Patent No.: US 11,875,272 B2
(45) Date of Patent: Jan. 16, 2024

(54) PROBABILISTIC COMPUTE ENGINE USING COUPLED RING OSCILLATORS

(71) Applicant: Regents of the University of Minnesota, Minneapolis, MN (US)

(72) Inventors: Hyung-il Kim, Minneapolis, MN (US); Ibrahim Ahmed, Minneapolis, MN (US); Po-wei Chiu, Minneapolis, MN (US)

(73) Assignee: REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 495 days.

(21) Appl. No.: 17/213,396

(22) Filed: Mar. 26, 2021

(65) Prior Publication Data

US 2021/0312298 A1   Oct. 7, 2021

Related U.S. Application Data

(60) Provisional application No. 63/003,490, filed on Apr. 1, 2020.

(51) Int. Cl.
*G06N 5/01* (2023.01)
*G06N 5/04* (2023.01)
(Continued)

(52) U.S. Cl.
CPC ............... *G06N 5/01* (2023.01); *B82Y 10/00* (2013.01); *G06F 17/10* (2013.01); *G06F 17/11* (2013.01);
(Continued)

(58) Field of Classification Search
CPC ........ H03K 3/0315; H03K 5/19; H03K 19/18; G06N 10/00; G06N 5/03; G06N 5/04;
(Continued)

(56) References Cited

U.S. PATENT DOCUMENTS

| 11,545,963 | B1 * | 1/2023 | Zick | H03K 3/0322 |
| 2021/0152125 | A1 * | 5/2021 | Chou | H03B 5/1228 |
| 2023/0132603 | A1 | 5/2023 | Kim et al. | |

OTHER PUBLICATIONS

M. Johnson, et al., "Quantum Annealing with Manufactured Spins," Nature, vol. 473, pp. 194-198, 2011.
(Continued)

*Primary Examiner* — Arnold M Kinkead
(74) *Attorney, Agent, or Firm* — Brian D. Kaul; Westman, Champlin & Koehler, P.A.

(57) ABSTRACT

Compute engine circuitry configured to represent a spin network mapping of a graph representing a combinatorial optimization problem includes a plurality of ring oscillator cells, each of which includes a ring oscillator having an oscillator output, at least one coupling block, and a read block. Each coupling block connects the ring oscillator of the cell to the ring oscillator of one of a plurality of neighboring cells to form a coupled ring oscillator. The read block generates a state output for each coupled ring oscillator that indicates whether the coupled ring oscillator is in one of a same-phase state, in which the connected ring oscillators oscillate in phase with each other, and an opposite-phase state, in which the connected ring oscillators oscillate in an opposite phase from each other. A controller is configured to output a total energy of the mapping based on the state outputs.

20 Claims, 6 Drawing Sheets

(51) Int. Cl.
*H03K 3/03* (2006.01)
*G06N 10/00* (2022.01)
*G06F 17/11* (2006.01)
*G06N 7/01* (2023.01)
*H03K 5/19* (2006.01)
*B82Y 10/00* (2011.01)
*H03K 19/18* (2006.01)
*G06N 7/08* (2006.01)
*G06F 17/10* (2006.01)

(52) U.S. Cl.
CPC ............... *G06N 5/04* (2013.01); *G06N 7/01* (2023.01); *G06N 7/08* (2013.01); *G06N 10/00* (2019.01); *H03K 3/0315* (2013.01); *H03K 5/19* (2013.01); *H03K 19/18* (2013.01)

(58) Field of Classification Search
CPC ... G06N 5/01; G06N 7/01; G06N 7/08; B82Y 10/00; H01L 27/18; G06F 17/11; G06F 17/10
USPC .................................... 326/47, 41; 331/2, 57
See application file for complete search history.

(56) References Cited

OTHER PUBLICATIONS

M. Yamaoka, C. Yoshimura, M. Hayashi, T. Okuyama, H. Aoki and H. Mizuno, "A 20k-Spin Ising Chip to Solve Combinatorial Optimization Problems With CMOS Annealing," in IEEE Journal of Solid-State Circuits, vol. 51, No. 1, pp. 303-309, Jan. 2016, doi: 10.1109/JSSC.2015.2498601.

T. Takemoto, M. Hayashi, C. Yoshimura and M. Yamaoka, "2.6 A 2×30k-Spin Multichip Scalable Annealing Processor Based on a Processing-In-Memory Approach for Solving Large-Scale Combinatorial Optimization Problems," 2019 IEEE International Solid-State Circuits Conference—(ISSCC), San Francisco, CA, USA, 2019, pp. 52-54, doi: 10.1109/ISSCC.2019.8662517.

A. Lucas, "Ising Formulations of Many NP Problems," Front. Phys., vol. 2, No. 5, pp. 1-15, 2014.

M. X., Goemans, et al., "Improved Approximation Algorithms for Maximum Cut and Satisfiability Problems Using Semidefinite Programming," JACM, vol. 42, No. 6, pp. 1115-1145, 1995.

I. Ahmed, et al., "A Probabilistic Self-annealing Compute Fabric based on 560 Hexagonally Coupled Ring Oscillators for Solving Combinatorial Optimization Problems," 2020 IEEE, Dept. of ECE, University of Minnesota, Minneapolis, MN, USA, 2020, 2 pgs.

I. Ahmed, et al., "A Probabilistic Compute Fabric Based on Coupled Ring Oscillators for Solving Combinatorial Optimization Problems," IEEE Journal of Solid-State Circuits, 2021 IEEE, 11 pgs.

P. Xiao, "Optoelectronics for refrigeration and analog circuits for combinatorial optimization" Electrical Engineering and Computer Sciences, University of California at Berkeley, Technical Report No. UCB/EECS-2019-74, http://www2.eecsberkeley.edu/Pubs/TechRpts/2019/EECS-2019-74.html. May 17, 2019, 155 pgs.

Yamaoka, M. "A 20k-Spin Ising Chip to Solve Combinatorial Optimization Problems With CMOS Annealing" IEEE Journal of Solid-State Circuits, vol. 51, No. 1, Jan. 2016, 7pgs.

* cited by examiner

PROBABILISTIC COMPUTE ENGINE USING COUPLED RING OSCILLATORS

CROSS-REFERENCE TO RELATED APPLICATION

The present application is based on and claims the benefit of U.S. provisional patent application Ser. No. 63/003,490, filed Apr. 1, 2020, the content of which is hereby incorporated by reference in its entirety.

GOVERNMENT FUNDING

This invention was made with government support under CCF-1739635 awarded by the National Science Foundation and 2018-NC-2759 awarded by the Semiconductor Research Corporation. The government has certain rights in the invention.

This invention was made with government support under Grant No. HR0011-18-3-0004 awarded by the Department of Defense/Defense Advanced Research Projects Agency (DARPA). The government has certain rights in the invention.

FIELD

The present disclosure relates to circuitry for solving combinatorial optimization problems and, more specifically, to compute engine circuitry that utilizes coupled ring oscillators to represent spin network mappings of systems for solving combinatorial optimization problems.

BACKGROUND

Combinatorial optimization problems (COPs), such as Boolean satisfiability, traveling salesman, and max-cut, are a class of nondeterministic polynomial-time hardness problems that are intractable to solve using a traditional computer due to the extremely large search space. Artificial intelligence decision making, vehicle routing, very large-scale integration layout optimization, network design, and many other modern applications can be modeled as COPs.

One promising approach to solving COPs involves transforming the COP into the Ising spin glass model, in which the COP is mapped to a network of spins. According to this approach, a graph representing a COP is formed, an example of which (graph 700) is illustrated in FIG. 7A. The graph 700 is then mapped to a network of spins 702, such as illustrated in FIG. 7B. In the mapping or network 702, the spins 704 represent the vertices 706 of the graph 700, and the couplings 708 between the spins 704 represent the edges 710 of the graph.

The COP is solved by letting the network naturally find its minimum energy state through coupling dynamics. Ideally, the energy of the system represented by the network 702 reaches the ground state or global minima 712 (FIG. 7C) based on the coupling of the spins 704, which is the solution of the COP. However, the system represented by the network 702 may get stuck in some local minima 714 along the way, requiring an annealing mechanism to escape from the suboptimal solution.

The states of all the spins 704 (e.g., 1 for up-spin and −1 for down-spin) in the network 702 determine the Ising Hamiltonian function, which denotes the total energy of the system represented by the network 702, and is the solution to the COP.

Previous hardware implementations of spin networks require quantum devices operating at cryogenic temperatures, are based on digital logic without the coupling dynamics, or require special processes.

SUMMARY

Embodiments of the present disclosure are directed to compute engine circuitry configured to represent a spin network mapping of a graph representing a combinatorial optimization problem (COP), and methods of using the circuitry to solve a COP. In one embodiment, the compute engine circuitry includes a plurality of ring oscillator cells, each of which includes a ring oscillator having an oscillator output, at least one coupling block, and a read block. Each coupling block connects the ring oscillator of the cell to the ring oscillator of one of a plurality of neighboring cells to form a coupled ring oscillator. The read block generates a state output for each coupled ring oscillator that indicates whether the coupled ring oscillator is in one of a same-phase state, in which the connected ring oscillators oscillate in phase with each other, and an opposite-phase state, in which the connected ring oscillators oscillate in an opposite phase from each other. A controller of the circuitry is configured to output an estimate of a total energy of the mapping based on the state outputs.

Another embodiment of the compute engine circuitry includes a plurality of ring oscillator cells, each of which includes a ring oscillator having an oscillator output, three coupling blocks, and a read block. Each coupling block connects the ring oscillator of the cell to the ring oscillator of one of a plurality of neighboring cells to form a coupled ring oscillator. The ring oscillator of each cell is connected to the ring oscillators of six of the neighbors through the coupling blocks of the cells. The read block generates a state output for each coupled ring oscillator that indicates whether the coupled ring oscillator is in one of a same-phase state, in which the connected ring oscillators oscillate in phase with each other, and an opposite-phase state, in which the connected ring oscillators oscillate in an opposite phase from each other. A controller of the circuitry is configured to output an estimate of a total energy of the mapping based on the state outputs.

Yet another embodiment is directed to a method of solving a COP. In the method, a spin network mapping of a graph representing the COP is formed using compute engine circuitry, which includes a controller and a plurality of ring oscillator cells, each of which includes a ring oscillator having an oscillator output, at least one coupling block, and a read block. Each coupling block connects the ring oscillator of the cell to the ring oscillator of one of a plurality of neighboring cells to form a coupled ring oscillator. The read block generates a state output for each coupled ring oscillator that indicates whether the coupled ring oscillator is in one of a same-phase state, in which the connected ring oscillators oscillate in phase with each other, and an opposite-phase state, in which the connected ring oscillators oscillate in an opposite phase from each other. Vertices of the spin network mapping of the COP are represented by the state outputs, and edges of the spin network mapping of the COP are represented by connections between the coupled ring oscillators. A total energy estimate of the mapping, which is representative of a solution to the COP, is output based on the state outputs using the controller.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION OF ILLUSTRATIVE EMBODIMENTS

Figure 1:
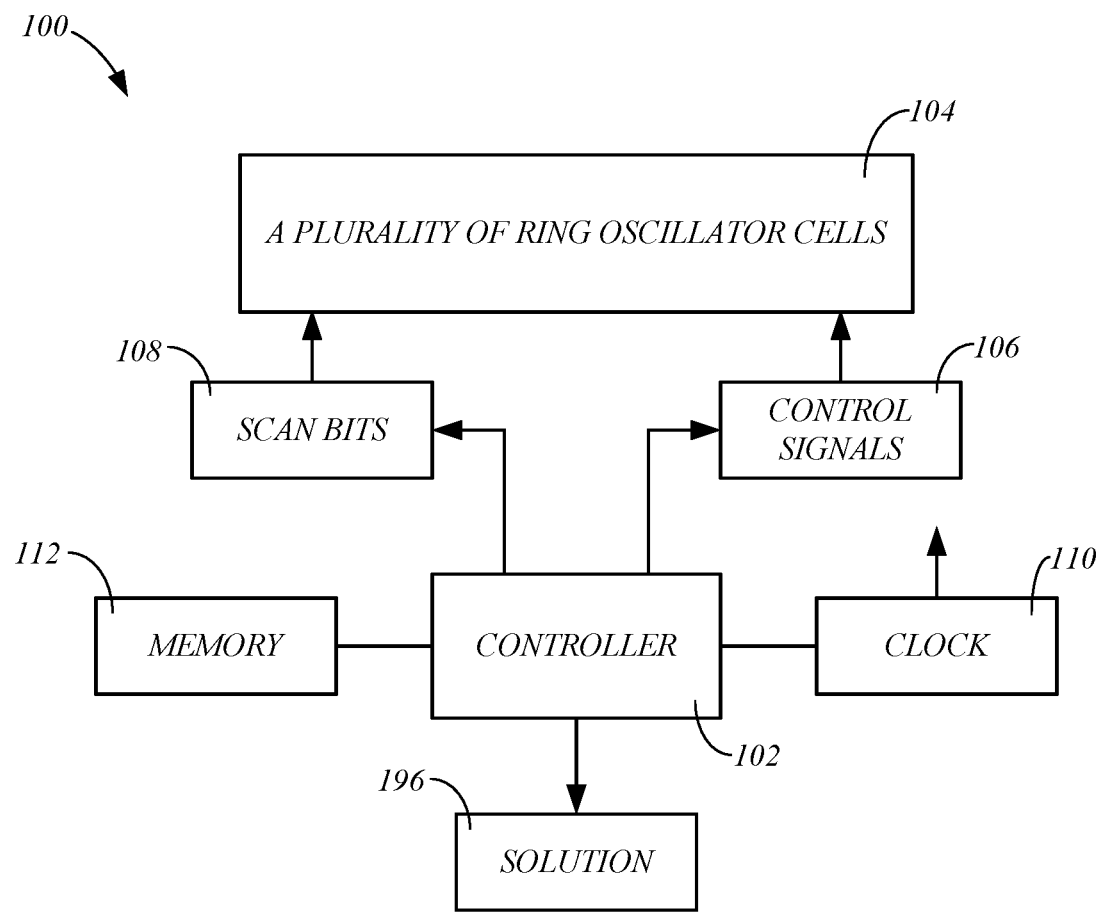
FIG. 1 is a simplified diagram of an example of compute engine circuitry, in accordance with embodiments of the present disclosure.

Embodiments of the present disclosure are described more fully hereinafter with reference to the accompanying drawings. Elements that are identified using the same or similar reference characters refer to the same or similar elements. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Specific details are given in the following description to provide a thorough understanding of the embodiments. However, it is understood by those of ordinary skill in the art that the embodiments may be practiced without these specific details. For example, circuits, systems, networks, processes, frames, supports, connectors, motors, processors, and other components may not be shown, or may be shown in block diagram form in order to not obscure the embodiments in unnecessary detail.

It will be understood that when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

Unless otherwise defined, all terms (including technical and scientific terms) used herein have the same meaning as commonly understood by one of ordinary skill in the art relating to the present disclosure. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "about," "substantially" or approximately refers to ±10% and the symbol denotes equality with a tolerance of at most 10%, unless stated otherwise.

Embodiments of the present disclosure relate to compute engine circuitry that is configured to provide a solution to combinatorial optimization problems (COPs), and methods of using the circuitry to solve COPs.

FIG. 1 is a simplified diagram of an example of compute engine circuitry 100, in accordance with embodiments of the present disclosure. In one embodiment, the circuitry 100 includes a controller 102 and a plurality of ring oscillator cells 104. The controller 102 represents one or more processors (e.g., a central processing unit) that control components of the circuitry 100 to perform one or more functions described herein. For example, the controller 102 may produce control signals 106 and program scan bits 108 for controlling the cells 104 and programing the cells 104 into a spin network mapping of a COP. The controller 102 may also control a clock 110 (e.g., frequency and voltage level), which may be used to synchronize the ring oscillator cells 104.

The controller 102 performs its control functions in response to the execution of instructions, which may be stored in memory 112 that represents local and/or remote memory or computer readable media. The memory 112 comprises any suitable patent subject matter eligible computer readable media that do not include transitory waves or signals such as, for example, embedded memory circuits such as static random access memory, dynamic random access memory, or non-volatile memory, for example. The one or more processors of the controller 102 may be components of one or more computer-based systems, and may include one or more control circuits, microprocessor systems, and/or one or more programmable hardware components, such as a field programmable gate array (FPGA).

Figure 2:
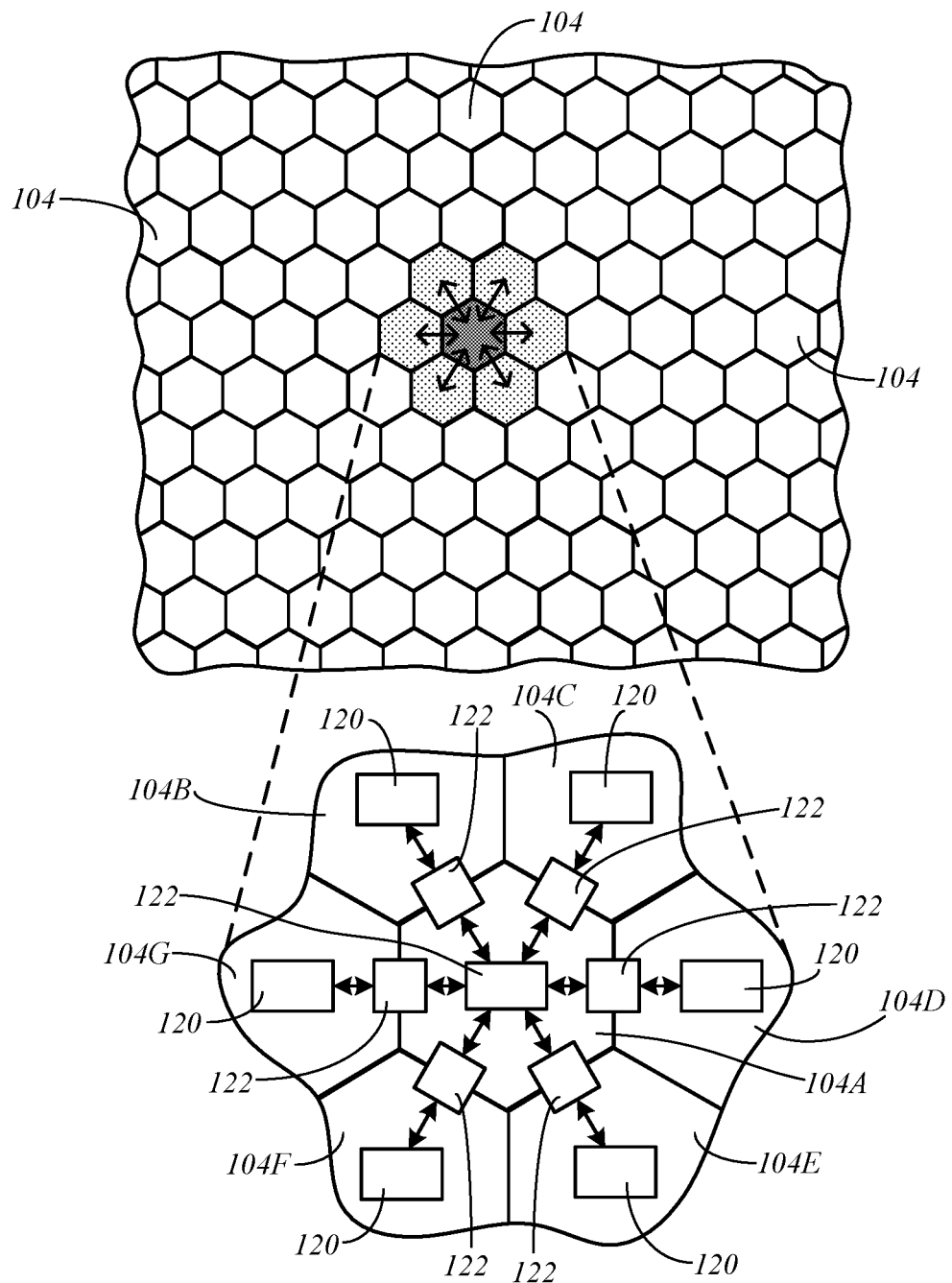
FIG. 2 is a simplified diagram illustrating an example of a circuit forming the plurality of cells and a magnified view of one of the cells and its neighboring cells, in accordance with embodiments of the present disclosure.

FIG. 2 is a simplified diagram illustrating a circuit forming the plurality of cells 104 and a magnified view of one of the cells 104A and its neighboring cells 104B-G (e.g., nearest neighboring cells), in accordance with embodiments of the present disclosure. Each of the cells 104 includes a ring oscillator 120. The ring oscillator 120 of each cell 104 is connected to the ring oscillators 120 of its neighboring cells 104 through coupling blocks 122. This causes the ring oscillator 120 of each cell 104 to oscillate in one of two states: in the same-phase or in the opposite-phase with the connected ring oscillators 120 of the neighbor cells 104.

Each of the cells 104 may be formed as a modular unit having a ring oscillator 120 that is coupled to the ring oscillators 120 of four or more neighboring cells 104 to form an array of cells, such as a 28×20 array of cells 104, for example. In the example of FIG. 2, the cells 104 are modular hexagonal unit cells, which allow the ring oscillators 120 of each of the non-border cells 104 to couple to the six ring oscillators 120 of the neighboring cells 104. The hexagonal structure of the cells 104 may be used to maximize the number of neighbors per cell in a 2D plane for mimicking a spin-based system, because the hexagon is the largest regular polygon that can tessellate a 2D plane. Other shapes, such as diagonal connections, all-to-all connections, hybrid (e.g. all-to-all coupled locally and near-neighbor coupled globally) architectures, bipartite graphs, etc., may also be used.

In the example cell array of FIG. 2, the ring oscillator 120 of cell 104A is connected to the ring oscillator 120 of neighboring cell 104B through a corresponding coupling block 122, the ring oscillator 120 of cell 104A is also connected to the ring oscillator 120 of the neighboring cell 104C through a corresponding coupling block 122, and the ring oscillator 120 of the cell 104A is also connected to the ring oscillators 120 of the neighboring cells 104D-G in a similar manner through the corresponding coupling blocks 122.

Figure 7A:
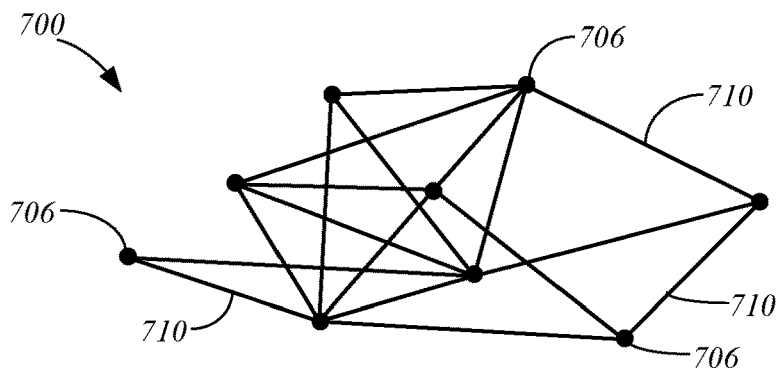
FIGS. 7A-C respectively illustrate examples of a graph representing a COP, a network of spins representing the graph, and a chart illustrating energy of the network, which are used to solve the COP.
Figure 7B:
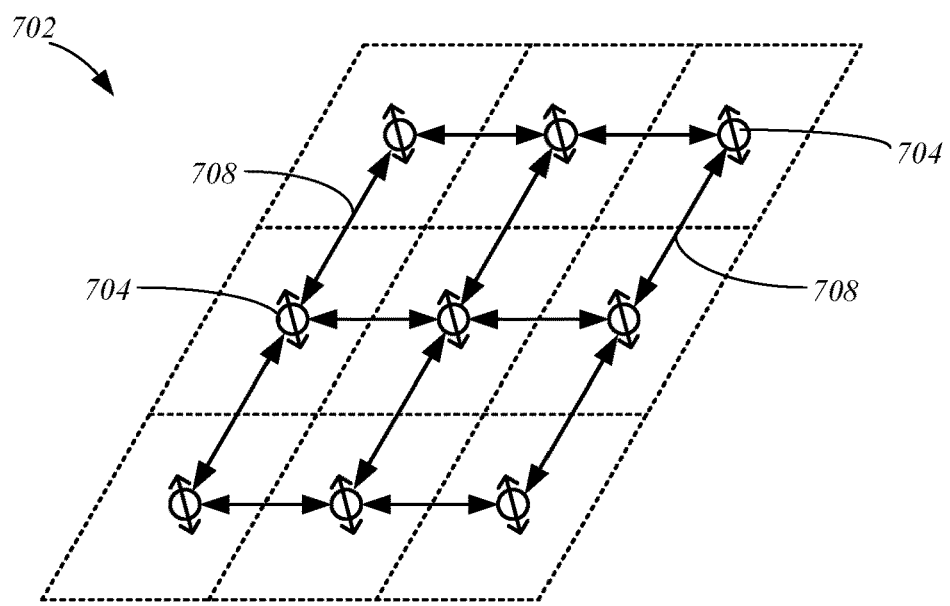

The plurality of cells 104 are configured to be programmed to represent a spin network mapping 702 (see, e.g., FIG. 7B) of a graph 700 (see, e.g., FIG. 7A) representing a combinatorial optimization problem (COP). The COP may be solved by calculating the total energy of the system or mapping based on the Ising Hamiltonian function provided in Equation 1, in which $n_i$ represents the number of coupled cell neighbors of the i-th cell, $s_i$ is the state of the spin of cell i (e.g., cell_A), $s_j$ is the state of the spin of neighboring cell j (cells_B-G), and $J_{ij}$ is the coupling weight between the cells i and j. The state of the spin of a cell 104 may be set, for example, to 1 when the ring oscillator 120 of the cell 104 is oscillating in the same phase as the ring oscillator 120 of its neighbor cell 104, and to −1 when the ring oscillator 120 of the cell 104 is oscillating in the opposite phase as the ring oscillator of its neighbor cell 104.

$$E_{system} = -\Sigma_{i=1}^{N} \Sigma_{j=1}^{n_i} J_{ij} \cdot s_i \cdot s_j \qquad \text{Eq. 1}$$

The coupling weight $J_{ij}$ models the affinity between the spins $s_i$ and $s_j$ of the cells 104. When the spins of two cells 104 are coupled with a positive coupling weight $J_{ij}$, their states will tend to resolve to the same states as this minimizes the energy. Likewise, negatively coupled spins of cells 104 would naturally converge towards opposite spin states to minimize the energy. More generally, a spin of a cell 104 may be acted upon by several coupled spins of the neighboring cells 104 with various polarities and coupling strengths, and the minimum energy state finds the optimum balance that minimizes the energy of the spin network.

The cells 104 may be programmed by the controller 102 to form the spin network mapping 702 of a particular COP by configuring the coupling weight $J_{ij}$. This may be accomplished, for example, through the setting of the scan bits 108, and the issuance of the control signals 106.

Figure 3:
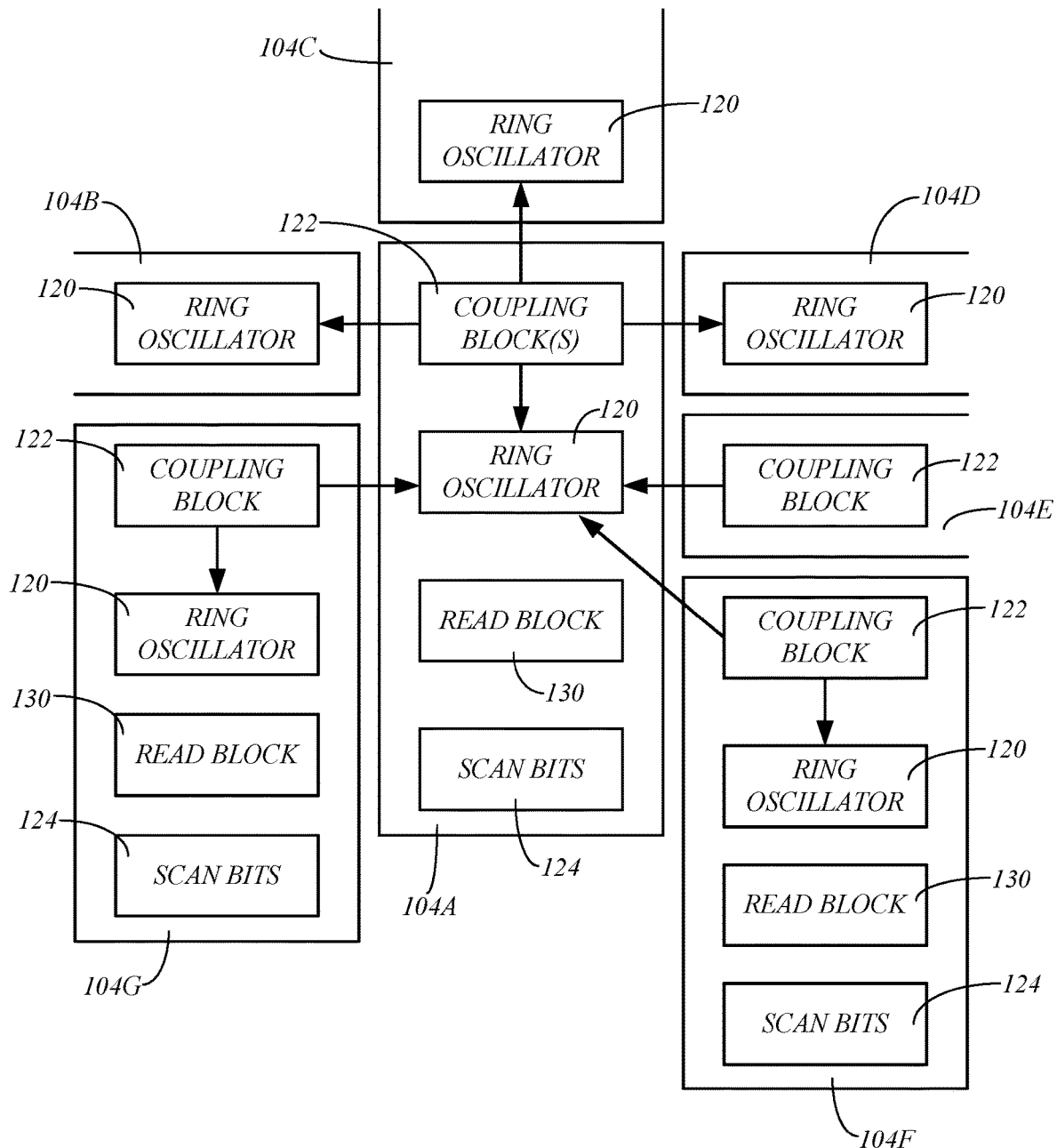
FIG. 3 is a simplified diagram illustrating examples of the ring oscillator cells, in accordance with embodiments of the present disclosure.

FIG. 3 is a simplified diagram illustrating examples of the ring oscillator cells 104A-G of FIG. 2, in accordance with embodiments of the present disclosure. Components of some of the cells 104 are not shown in order to simplify the drawing. As discussed above, each cell 104 includes a ring oscillator 120 and coupling blocks 122. Each cell 104 also includes scan bits 124 for controlling its operation in the spin network, which are programmed by the controller 102, as mentioned above.

In one example of the hexagonal cell, each cell 104 includes three coupling blocks 122 that are used to couple its ring oscillator 120 to the ring oscillators 120 of three of its neighbor cells 104. For example, the cell 104A may include three coupling blocks 122, each of which couples the ring oscillator 120 to one of the ring oscillators 120 of the neighboring cells 104B-D. Each of the remaining three connections between the ring oscillator 120 of the cell 104A and the ring oscillators 120 of the neighboring cells 104E-G may be provided by one of the coupling blocks 122 of each of the neighboring cells 104E-G. When the cells 104 are configured to connect to four neighboring cells 104, each cell 104 may include, for example, two coupling blocks 122 to provide the desired ring oscillator couplings. Other configurations may also be used.

In some embodiments, each cell 104 includes a read block 130. The read block 130 is configured for use in measuring or comparing the phase of the ring oscillator 120 of its cell 104 relative to the ring oscillators 120 of each of the neighboring cells 104.

The ring oscillator cells 104 may be formed using conventional circuit components, such as CMOS transistors, and/or other conventional components, and the cells 104 may be formed in an integrated circuit chip. The ring oscillators 120 and coupling blocks 122 of the cells may take on any suitable form.

Figure 4:
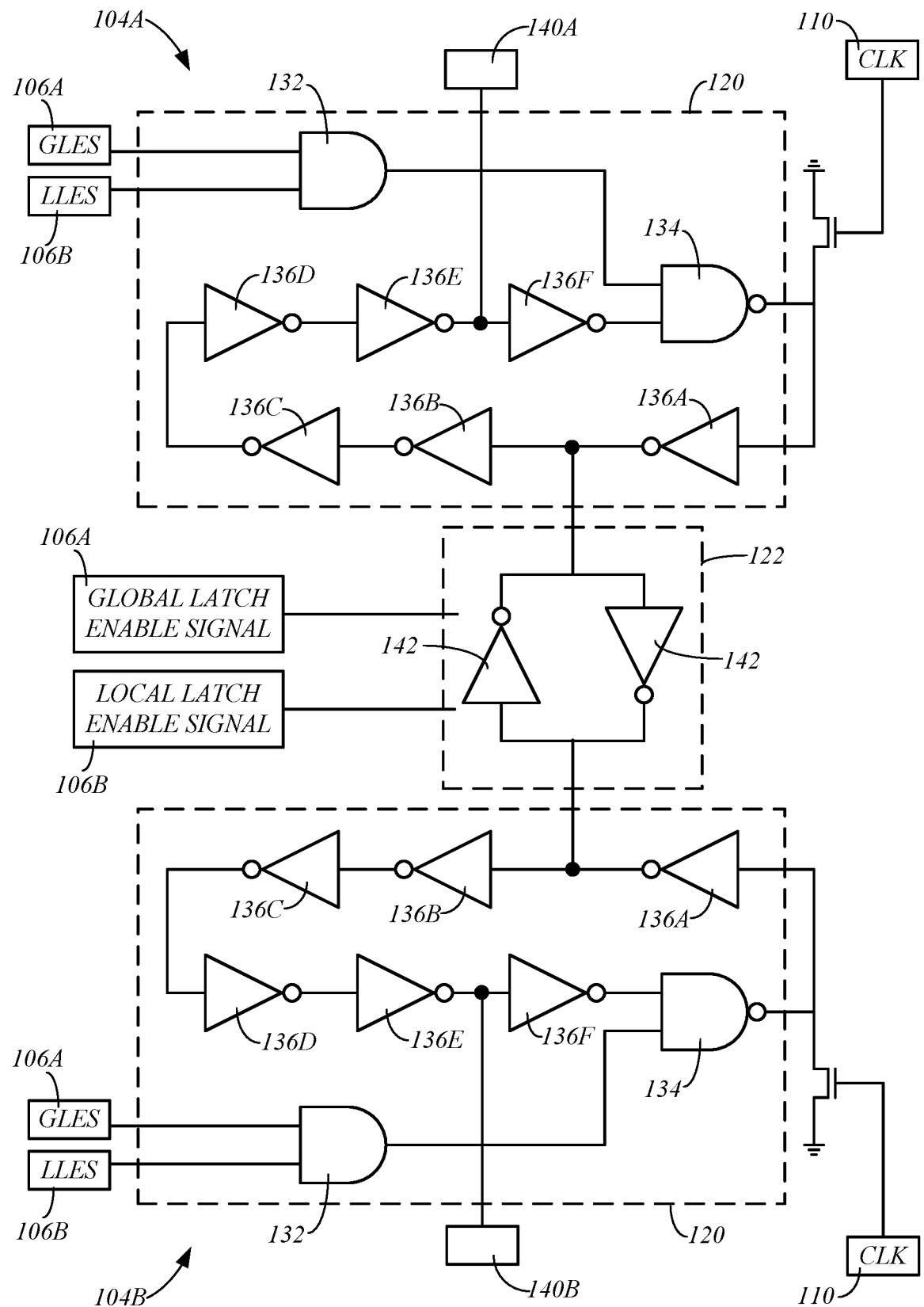
FIG. 4 is a schematic diagram of examples of a pair of ring oscillators connected to each other through a coupling block, in accordance with embodiments of the present disclosure.

Examples of the ring oscillators 120 of two cells 104A and 104B and a coupling block 122 connecting the two oscillators 120 are shown in the schematic diagram of FIG. 4. The ring oscillators 120 and the coupling block 122 may receive control signals 106 from the controller 102 in the form of a global latch enable signal 106A and/or a local latch enable signal 106B, which are used to control their operation. This allows the ring oscillators 120 of any cell to be programmed to couple with the ring oscillators of any of its neighbor cells 104.

The ring oscillators 120 may also be synchronized with the clock or clock signal 110. In some embodiments, the clock 110 has a frequency that is twice the frequency of the ring oscillators 120 to lock the oscillator phases to either the odd or even cycles of the clock signal. In one example, the clock frequency may be approximately 235 MHz, and the frequency of the ring oscillators 120 is approximately 118 MHz at nominal voltage at drain (Vdd) and room temperature. The controller 102 may be configured to modulate the voltage level of the clock signal 110.

The example ring oscillators 120 shown in FIG. 4 each include an AND gate 132 that receives the global and local latch enable signals 106A and 106B. The output of the AND gate 132 is fed to a NAND gate 134. The output of the NAND gate 134 is fed to a series of inverters 136A-F, and the output from the inverter 136F is input to the NAND gate 134. In one embodiment, the ring oscillators 120 each have an oscillator output 140 that is connected between the inverters 136E and 136F. As discussed below, the oscillator outputs 140 may be received by the read block 130 and used to determine the relative phases of the ring oscillators 120.

The coupling block 122 may comprise a latch, which may include back-to-back inverters 142, or have another suitable form. In one example, each side of the coupling block 122 is connected to the corresponding ring oscillator 120 between the inverters 136A and 136B.

Figure 5:
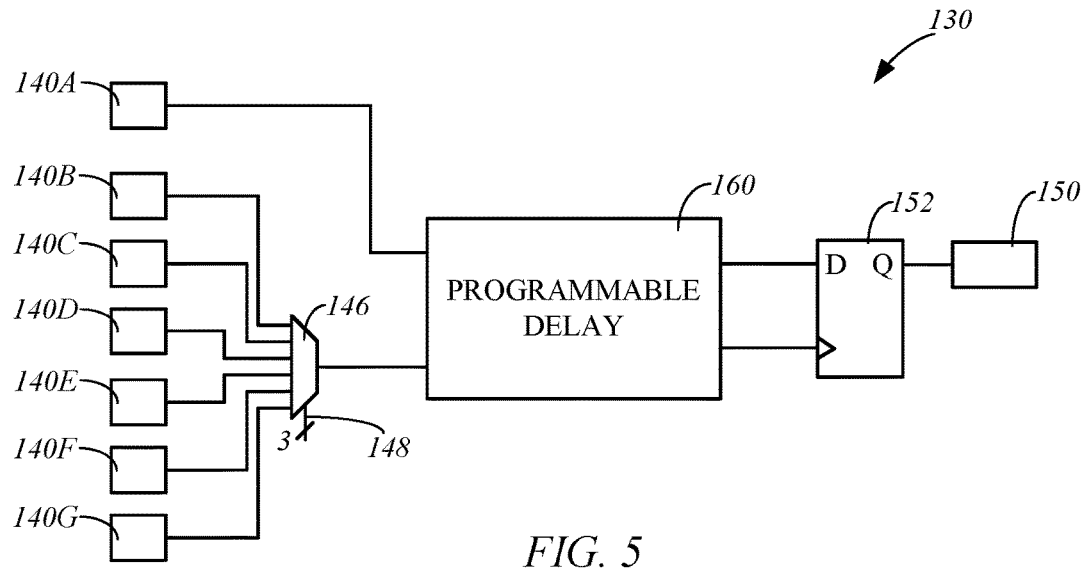
FIG. 5 is a simplified diagram of a read block in accordance with embodiments of the present disclosure.

The read block 130 is used to measure the relative phase (same-phase or opposite-phase) of the ring oscillator 120 of a current cell 104 with one or more of the ring oscillators 120 of the neighboring cells 104 using the corresponding oscillator outputs 140, to establish the spin state of the current cell 104. FIG. 5 is a simplified diagram of an example of a read block 130 in accordance with embodiments of the present disclosure. The illustrated example uses the oscillator outputs 140A-G of the group of cells 104A-G of FIG. 2 with the cell 104A acting as the current cell, and the cells 104B-G being the neighboring cells. Thus, the read block 130 receives the oscillator output 140A from the ring oscillator 120 of cell 104A, and the oscillator outputs 140B-G from the ring oscillators 120 of the corresponding neighboring cells 104B-G.

The read block 130 may include a multiplexor 146 to select one of the oscillator outputs 140B-G from the neighboring cells 104B-G using a three-bit control signal 148, such as from the controller 102 (FIG. 1). The oscillator output from the multiplexor 146, such as oscillator output 140B, can be compared to the oscillator output 140A of the current cell 104A to determine whether its ring oscillator 120 is the same-phase or the opposite-phase of the ring oscillator 120 of the cell 104B. The result of the comparison may be output as a state output 150 (1=same-phase, 0=opposite-phase) through a D flip flop 152, for example. The control signal 148 to the multiplexor 146 may then select a different oscillator output 140 from one of the neighboring cells 104C-G for comparison with the oscillator output 140A of the current cell 104A. This process can continue until the desired comparisons are completed.

In one embodiment, the read blocks 130 may include a programmable delay circuit 160 that allows the controller 102 to sweep different delays to clarify whether the phases of the oscillator outputs 140 being compared are close to each other or substantially in the same phase, or very different from each other or substantially in the opposite phase. The programmable delay circuit 160 may take on any suitable form.

Figure 6:
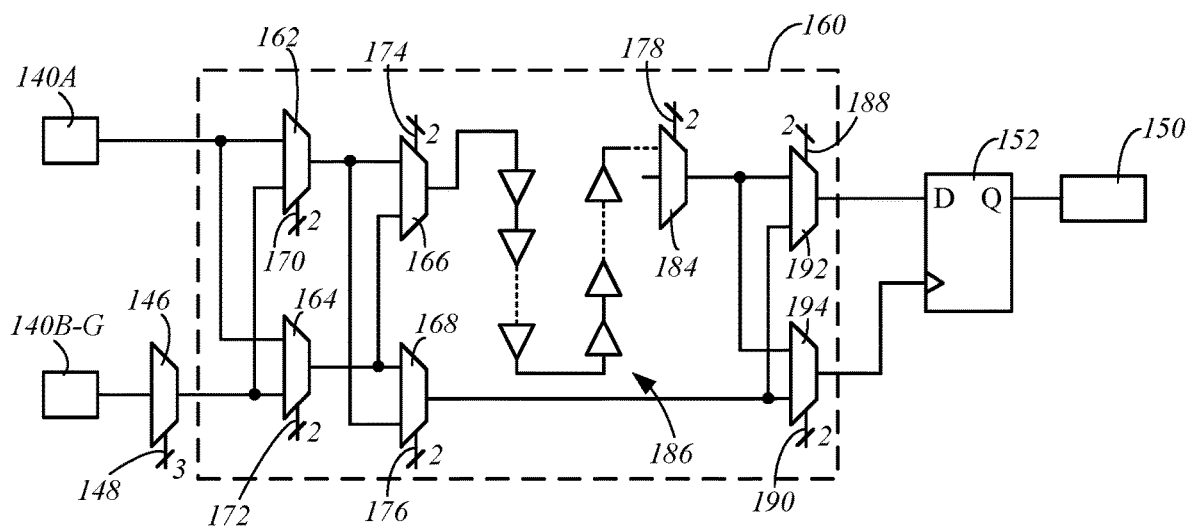
FIG. 6 is a schematic diagram of an example of a read block having a programmable delay circuit, in accordance with embodiments of the present disclosure.

One example of a suitable programmable delay circuit 160 is shown in the simplified diagram of FIG. 6. The programmable delay circuit 160 includes a pair of multiplexors 162 and 164 that allows for the selective delivery of the oscillator output 140 from the current cell 104 (e.g., 104A) and the oscillator output 140 from the selected neighboring cell (e.g., one of cells 104B-G) to either the multiplexor 166 or the multiplexor 168, based on two-bit control signals 170 and 172, which may be issued by the controller 102. The oscillator outputs 140 (e.g., outputs 140A and 140B) may then proceed along various paths based on two-bit control signals 174, 176 and 178 to the multiplexors 166, 168 and 184, with the path through a series of buffers 186 having the most delay. Finally, the oscillator outputs 140 are delivered to the D flip flop 152 based on the two-bit control signals 188 and 190 to the multiplexors 192 and 194, to provide the state output 150 corresponding to the phase of the ring oscillator 120 of the current cell (e.g., cell 104A) to the ring oscillator 120 of the neighboring cell (e.g., cell 104B).

The controller 102 uses the state outputs 150 provided by the read blocks 130 of the cells 104 forming the spin network mapping to estimate or calculate the total energy of the mapping, which is a solution 196 to the COP, as indicated in FIG. 1.

Figure 7C:
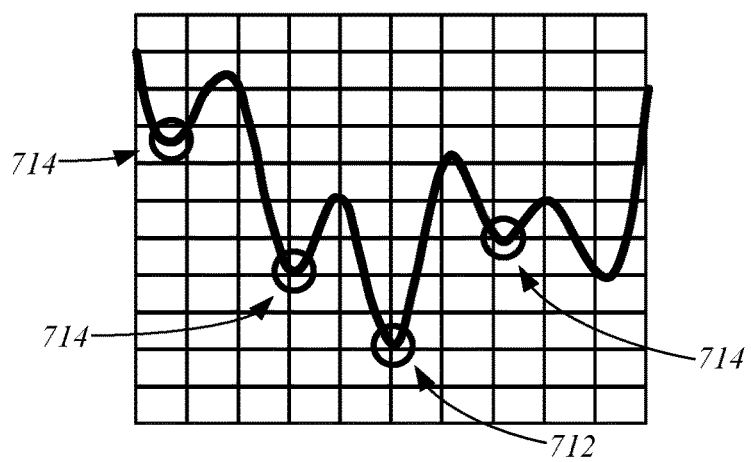

In some embodiments, after programming the cells 104 to form a spin network mapping 702 of a COP, the controller 102 performs a self-annealing process to ensure that the states of the cells 104 are randomized. The probabilistic nature of the initial states helps the compute engine circuitry 100 to explore different minima locations (see FIG. 7C). In one embodiment, this annealing process involves activating the ring oscillators 102 of the cells 104 before the global latch enable signal 106A is asserted. The controller 102 may process the spin network mapping to obtain a solution 196 to the COP based on the state outputs 150 after each self-annealing process to explore different energy minima locations or potential solutions to the COP.

Unlike previous hardware implementations of spin networks that require quantum devices operating at cryogenic temperatures, the compute engine circuitry 100 is capable of solving COPs while operating at room temperature. Additionally, the compute engine circuitry 100 includes digital logic with coupling dynamics without the need for special processes, unlike prior art hardware implementations of spin networks.

Some embodiments of the present disclosure are directed to a method of using the compute engine circuitry 100 described above to solve a COP. In one embodiment, a spin network mapping 702 of a graph 700 representing the COP is formed using the compute engine circuitry 100 in accordance with one or more embodiments described above. As discussed, the spin network mapping 702 may be formed by the controller 102 controlling the scan bits 108 and the control signals 106 (e.g., global latch enable signal, local latch enable signal, control signals, etc.) to the cells 104 including the ring oscillators 120, the coupling blocks 122 and the read blocks 130 of the cells 104. The read blocks 130 of the cells 104 compare the oscillator output 140 of their corresponding ring oscillator 120 to the oscillator outputs 140 of one or more of its connected neighboring cells 104, and produces state outputs 150 indicating the phase of the ring oscillator 120 of its cell 104 relative to the phase of the connected ring oscillators 120 of the neighboring cells 104. The state outputs 150 are used by the controller 102 to calculate or estimate a total energy of the mapping, which is a solution 196 to the COP. In some embodiments, the self-annealing process is performed on the cells 104 by the controller 102 after the controller 102 programs or forms the spin network mapping using the cells 104, and prior to attempting to produce a solution 196 to the COP based on the state outputs 150.

Although the embodiments of the present disclosure have been described with reference to preferred embodiments, workers skilled in the art will recognize that changes may be made in form and detail without departing from the spirit and scope of the present disclosure.

What is claimed is:

1. Compute engine circuitry configured to represent a spin network mapping of a graph representing a combinatorial optimization problem, the compute engine circuitry comprising:
    a plurality of ring oscillator cells, each comprising:
        a ring oscillator having an oscillator output;
        at least one coupling block, each coupling block connecting the ring oscillator of the cell to the ring oscillator of one of a plurality of neighboring cells to form a coupled ring oscillator; and
        a read block configured to generate a state output for each coupled ring oscillator that includes the ring oscillator of the cell, the state output indicating whether the coupled ring oscillator is in one of a same-phase state, in which the connected ring oscillators oscillate in phase with each other, and an opposite-phase state, in which the connected ring oscillators oscillate in an opposite phase from each other; and
    a controller configured to output an estimate of a total energy of the mapping based on the state outputs.

2. The compute engine circuitry of claim 1, wherein the ring oscillator of each cell is connected to the ring oscillators of four or more of the neighboring cells through the coupling blocks of the cells.

3. The compute engine circuitry of claim 1, wherein the ring oscillator of each cell is connected to the ring oscillators of six of the neighboring cells through the coupling blocks of the cells.

4. The compute engine circuitry of claim 2, wherein the controller includes a clock configured to generate a clock signal at a clock frequency, which is supplied to each of the cells.

5. The compute engine circuitry of claim 4, wherein the clock circuitry controls a ring frequency of each of the ring oscillators.

6. The compute engine circuitry of claim 5, wherein the clock frequency is greater than the ring frequency.

7. The compute engine of claim 6, wherein the clock frequency is approximately twice the ring frequency.

8. The compute engine circuitry of claim 4, wherein the controller supplies each cell with scan bits, which control the at least one coupling block and the read block of the cell.

9. The compute engine of claim 8, wherein the read circuit of each cell includes a multiplexor configured to selectively output any one of the oscillator outputs of the coupled ring oscillators that include the ring oscillator of the cell.

10. The compute engine of claim 9, wherein the read circuit of each cell includes a programmable delay circuit.

11. The compute engine circuitry of claim 9, wherein each coupling block comprises a plurality of latches.

12. The compute engine circuitry of claim 9, wherein the plurality of cells are contained in an integrated circuit chip.

13. Compute engine circuitry configured to represent a spin network mapping of a graph representing a combinatorial optimization problem, the compute engine circuitry comprising:
  a plurality of ring oscillator cells, each comprising:
    a ring oscillator having an oscillator output;
    three coupling blocks, each coupling block connecting the ring oscillator of the cell to the ring oscillator of one of a plurality of neighboring cells to form a coupled ring oscillator; and
    a read block configured to generate a state output for each coupled ring oscillator that includes the ring oscillator of the cell, the state output indicating whether the coupled ring oscillator is in one of a same-phase state, in which the connected ring oscillators oscillate in phase with each other, and an opposite-phase state, in which the connected ring oscillators oscillate in an opposite phase from each other; and
  a controller configured to output an estimate of a total energy of the mapping based on the state outputs,
  wherein the ring oscillator of each cell is connected to the ring oscillators of six of the neighboring cells through the coupling blocks of the cells.

14. The compute engine circuitry of claim 13, wherein the controller includes a clock configured to generate a clock signal at a clock frequency, which is supplied to each of the cells.

15. The compute engine circuitry of claim 14, wherein the clock circuitry controls a ring frequency of each of the ring oscillators.

16. The compute engine circuitry of claim 15, wherein the clock frequency is greater than the ring frequency.

17. The compute engine circuitry of claim 14, wherein the controller supplies each cell with scan bits, which control the at least one coupling block and the read block of the cell.

18. The compute engine of claim 17, wherein the read circuit of each cell includes a multiplexor configured to selectively output any one of the oscillator outputs of the coupled ring oscillators that include the ring oscillator of the cell.

19. The compute engine circuitry of claim 18, wherein the plurality of cells are contained in an integrated circuit chip.

20. A method of solving a combinatorial optimization problem (COP) comprising:
  forming a spin network mapping of a graph representing the COP using compute engine circuitry, the circuitry comprising:
    a plurality of ring oscillator cells, each comprising:
      a ring oscillator having an oscillator output;
      at least one coupling block, each coupling block connecting the ring oscillator of the cell to the ring oscillator of one of a plurality of neighboring cells to form a coupled ring oscillator; and
      a read block configured to generate a state output for each coupled ring oscillator that includes the ring oscillator of the cell, the state output indicating whether the coupled ring oscillator is in one of a same-phase state, in which the connected ring oscillators oscillate in phase with each other, and an opposite-phase state, in which the connected ring oscillators oscillate in an opposite phase from each other; and
    a controller,
    wherein vertices of the spin network mapping of the COP are represented by the state outputs, and edges of the spin network mapping of the COP are represented by connections between the coupled ring oscillators; and
  outputting a total energy estimate of the mapping, which is representative of a solution to the problem, based on the state outputs using the controller.

* * * * *